(12) United States Patent
Xu et al.

(10) Patent No.: US 9,966,967 B2
(45) Date of Patent: May 8, 2018

(54) HIGH SPEED SUCCESSIVE APPROXIMATION ANALOG-TO-DIGITAL CONVERTER OF TWO BITS PER CYCLE

(71) Applicant: China Electronic Technology Corporation, 24th Research Institute, Chongqing (CN)

(72) Inventors: Dai-Guo Xu, Chongqing (CN); Shi-Liu Xu, Chongqing (CN); Gang-Yi Hu, Chongqing (CN); Guang-Bing Chen, Chongqing (CN); Jian-An Wang, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 0 days. days.

(21) Appl. No.: 15/521,178

(22) PCT Filed: May 21, 2015

(86) PCT No.: PCT/CN2015/079456
§ 371 (c)(1),
(2) Date: Apr. 21, 2017

(87) PCT Pub. No.: WO2016/183839
PCT Pub. Date: Nov. 24, 2016

(65) Prior Publication Data
US 2017/0331486 A1 Nov. 16, 2017

(30) Foreign Application Priority Data

May 19, 2015 (CN) .......................... 2015 1 0256338

(51) Int. Cl.
*H03M 1/12* (2006.01)
*H03M 1/08* (2006.01)
(Continued)

(52) U.S. Cl.
CPC ............ *H03M 1/0809* (2013.01); *H03M 1/00* (2013.01); *H03M 1/0695* (2013.01);
(Continued)

(58) Field of Classification Search
CPC ......... H03M 1/00; H03M 1/12; H03M 1/0695
(Continued)

(56) References Cited

U.S. PATENT DOCUMENTS 8,421,658 B1 * 4/2013 Yau ..................... H03M 1/1004
341/118

\* cited by examiner

*Primary Examiner* — Joseph Lauture
(74) *Attorney, Agent, or Firm* — Cheng-Ju Chiang

(57) ABSTRACT

A high-speed successive approximation analog-to-digital converter of two bits per cycle, includes three switches, two capacitor arrays, three comparators, an encoding circuit, a first switch array corresponding to the first capacitor array, a second switch array corresponding to the second capacitor array, a shifting register and a digital correction unit. The analog-to-digital converter, featuring doubled speed, realizes a successive approximation process without any fault when a high-bit large capacitor is unsettled. Thus no redundancy bit capacitor is required to compensate for unsettled pre-stage large capacitor. By using the encoding circuit, a thermometer code is converted into a binary code effectively, and inherent errors of comparators are reduced by the randomization of three comparators.

5 Claims, 13 Drawing Sheets

(51) Int. Cl.
H03M 1/20 (2006.01)
H03M 1/28 (2006.01)
H03M 1/10 (2006.01)
H03M 1/06 (2006.01)
H03M 1/00 (2006.01)

(52) U.S. Cl.
CPC ............ *H03M 1/1023* (2013.01); *H03M 1/12* (2013.01); *H03M 1/204* (2013.01); *H03M 1/282* (2013.01)

(58) Field of Classification Search
USPC .................. 341/155, 118, 120, 161, 156
See application file for complete search history.

HIGH SPEED SUCCESSIVE APPROXIMATION ANALOG-TO-DIGITAL CONVERTER OF TWO BITS PER CYCLE

BACKGROUND OF THE INVENTION

Technical Field

The present invention relates to analog and mixed-signal integrated circuits, particularly to high-speed successive approximation analog-to-digital converters of two bits per cycle.

2. Background Art

As CMOS integrated circuit technology develops, successive approximation analog-to-digital converters develop featuring better performance. Two conventional successive approximation analog-to-digital converters are compared as follows regarding their merits and defects.

A successive approximation analog-to-digital converter of one bit per cycle, featuring a capacitor array and a comparator, is illustrated as shown in FIG. 1. It works in a way that, as the circuit samples, the sampling switch S1 is switched on, the sample plates of capacitor array DAC are used to sample input signals VIN+ and VIN− and non-sample plates of capacitor array DAC are connected to a common-mode voltage VCM; as soon as sampling stage ends. The switch S1 is turned off and a comparator COMP is used to successively compare voltage VP with voltage VN on the sampling plates of capacitor array DAC, outputting one digital code every comparison period. Each compared result from the highest bit to the lowest bit is used to successively control each capacitor of the capacitor array DAC till successive approximation process ends. The circuit, featuring simple structure, requires one capacitor being established in every comparison cycle. If a capacitor is not established, the circuit can be compensated by inserting a redundancy bit in the following stage. However, an N-bit successive approximation analog-to-digital converter requires at least N comparison periods for the final result. Therefore, it can hardly find its application in high speed circuits.

To solve the problems, a successive approximation analog-to-digital converter of two bits per cycle is introduced comprising one capacitor array and three comparators as shown in FIG. 2. It works in a way that, when the circuit is at a sampling stage, a sampling switch S1 is turned on, the sampling plates of a capacitor array DAC are used to sample input signals VIN+ and VIN−, the non-sampling plates of the capacitor array DAC are connected to a common-mode voltage VCM. When the sampling stage ends, the switch S1 is turned off, the comparators COMP1, COMP2 and COMP3 successively compare voltages VP and VN on the sampling plates of the capacitor array DAC. A difference between the voltages VP and VN on the sampling plates is compared with three reference voltages at the same time, outputting a three-bit thermometer code. The three-bit thermometer code is then converted into a binary code through an encoding circuit ENCODE. That is to say, two digital codes CODEM/CODEL are output every comparison cycle. The comparison results are used to successively control every two capacitors of the capacitor array DAC from the highest bit to the lowest bit till the successive approximation process ends. Therefore, N-bit successive approximation analog-to-digital converter requires only N/2 comparison periods for the final result. The circuit of two bits per cycle works two times faster than that of 1 bit per cycle, in ways that greatly improves its speed. Yet, the circuit of two bits per cycle has disadvantages as follows, as two capacitors are required each approximation stage, it takes a long time for settling time of two capacitors of the highest and second highest bit capacitors, which terribly affects the circuit speed. Meanwhile, it is difficult to make compensation in subsequent approximation process by inserting a redundancy bit. Therefore, there are disadvantages for both as mentioned above.

BRIEF SUMMARY OF THE INVENTION

The present invention provides a novel high-speed successive approximation analog-to-digital converter of two bits per cycle to solve the problems that conventional converters cannot tackle.

The successive approximation analog-to-digital converter of one bit per cycle structure in the prior art featuring low working speed can hardly find applications in high speed circuits. However, the successive approximation type analog-to-digital converter of the two bits per cycle structure works a very long time to simultaneously establish two capacitors in each approximation period, which may seriously affect the working speed of the entire circuit. And it is also very difficult to perform compensation in a subsequent approximation process with a redundancy bit inserting method.

To achieve objects as described above, the present invention approaches technical solutions as follows:

A high-speed successive approximation analog-to-digital converter of two bits per cycle includes:

a switch S2, a sampling switch S1 and a sampling switch S3, turned on according to a sampling signal, when a high bit large capacitor is established, the switches S1 and S3 remain turned off and the switch S2 is turned on again;

capacitor arrays DAC1 and DAC2, when a circuit is at a sampling stage and the switches S1, S2 and S3 are turned on simultaneously, the capacitor arrays DAC1 and DAC2 are used to simultaneously sample input signals VIN+ and VIN− with sampling plates thereof, when the high-bit large capacitor is established, non-sampling plates of capacitors of the capacitor array DAC2 are reset to enter the sampling stage and capacitors of the capacitor array DAC1 remain connected to a corresponding reference voltage to restart a successive approximation process;

comparators COMP1, COMP2 and COMP3, when the sampling stage ends and the switches S1, S2 and S3 are turned off, the comparators COMP1, the COMP2 and COMP3 are used to compare a difference between voltages VP and VN on the sampling plates of the capacitor arrays DAC1 and DAC2 with three reference voltages, and each of three comparators outputs a three-bit thermometer code after each comparison;

an encoding circuit, used to convert a three-bit thermometer code into a two-bit binary code to output a two-bit digital code each comparison period;

a switch array SW1 corresponding to the capacitor array DAC1 and a switch array SW2 corresponding to the capacitor array DAC2, used to simultaneously and progressively connect the reference voltages to the corresponding two-bit capacitors of DAC2 and DAC1 in a sequence from the highest bit to the lowest bit, as soon as all the capacitors of the capacitor array DAC2 are connected to the corresponding reference voltages and all the capacitors of the capacitor array DAC1 are connected to a corresponding reference voltages, at the same time, the high-bit large capacitor is established; and a shift register and a digital correction unit, used to rearrange and output two-bit digital codes in parallels during each comparison period.

The successive approximation analog-to-digital converter of two bits per cycle features two times speed than a traditional one of one bit per cycle structure. Compared with a conventional successive approximation analog-to-digital converter of two bits per cycle structure, the novel converter in the invention can proceed with a successive approximation process without any redundancy bit capacitor being used to compensate incomplete establishment of pre-stage large capacitor. No fault occurs as the way it goes above. Meanwhile, the encoding circuit is used to convert a thermometer code into a binary code effectively. And the inherent comparator error can be reduced by randomly gating three comparators.

Further, the capacitor array DAC1 is a high-bit capacitor array comprising N capacitors in parallel, wherein, N is an even number, the N capacitors from a highest bit to a lowest bit are expressed as: $2^{(2N-1)}C$, $2^{(2N-2)}C$, ..., $2^{(N+1)}C$, $2^{N}C$, and C is a capacitance value of a unit capacitance. The capacitor array DAC2 is a low-bit capacitor array comprising N+1 capacitors in parallel, wherein the N+1 capacitors from a highest bit to a lowest are expressed as: $2^{(N-1)}C$, $2^{(N-2)}C$, ..., 2C, C, C, and the non-sampling plate of lowest bit capacitor C in the capacitor array DAC2 is connected to a common-mode voltage VCM all the time.

Further, the sampling plates of the capacitor array DAC1 and the capacitor array DAC2 are controlled by the sampling switches S1 and S3. The switch S2 is used to connect the sampling plate of the capacitor array DAC1 to the sampling plate of the capacitor array DAC2.

Further, the encoding circuit includes a low-bit digital code generator and a high-bit digital code generator. The low-bit digital code generator comprises an XNOR gate and an AND gate, two input ends of the XNOR gate are connected to positive output ends of the comparator COMP2 and the comparator COMP3. Two input ends of the AND gate are connected to an output end of the XNOR gate and a positive output end of the comparator COMP1. An output end of the AND gate works to generate a lower bit of the two-bit digital code, noted as CODEL. The high-bit digital code generator comprises an AND gate and an OR gate, two input ends of the AND gate are connected to the positive output ends of the comparators COMP1 and COMP2, two input ends of the OR gate are connected to an output end of the AND gate and the positive output end of the comparator COMP3, and an output end of the OR gate generates a higher bit of the two-bit digital code, recorded as CODEM.

Further, the high-speed successive approximation analog-to-digital converter of two bits per cycle further includes an NAND gate being correspondingly connected to output ends of each comparator, and the output end of the NAND gate outputs a clock signal Valid.

Further, the shift register comprises N D triggers DFF1, N−1 inverters and N D triggers DFF2, wherein N is a positive integer no less than 3, the clock signal Valid is connected to a clock end of each D trigger DFF1, reset ports S of the first to the $N^{th}$ D triggers DFF1 are connected to the sampling signal Clks, an input end D of the first D trigger DFF1 is connected to a power supply VDD. An output end Q of each D trigger DFF1 is connected to an input end D of the next D trigger DFF1 thereof in sequence, output ends Q from the first to the $N^{th}$ D triggers DFF1 respectively output first output signals Clk1 to ClkN, the output ends Q from the first to the $N^{th}$ D triggers DFF1 are correspondingly connected to input ends of the first to the $(N-1)^{th}$ inverters in sequence, and an output end of each inverter is connected to a reset end S of the corresponding D trigger DFF2 thereof in sequence; and latch ends L of the first to the $N^{th}$ D triggers DFF2 are correspondingly connected to the output ends Q of the first to the $N^{th}$ D triggers DFF1, a reset end S of the first D trigger DFF2 is connected to a sampling signal Clks, output ends of the first to the $(N-1)^{th}$ inverters are correspondingly connected to reset ends S of the second to the $N^{th}$ D triggers DFF2, the output ends of the comparators are connected to the input end of each D trigger DFF2, the clock signal Valid is connected to a clock end of each D trigger DFF2, and output ends of the first to the $N^{th}$ D triggers DFF2 output second output signals D1 to DN in sequence.

Further, the D trigger DFF1 includes a first OR gate, a first inverter, a second inverter, a third inverter, a first NMOS transistor, a first transmission gate and a second transmission gate, wherein the input end of the first OR gate is connected to the clock signal and a reset signal and its output end is connected to the input end of the first inverter, the output ends of the first OR gate and the first inverter are respectively connected to two control ends of the first and second transmission gates, the input signal of the D trigger DFF1 is connected to one end of the first transmission gate, the other end of the first transmission gate is connected to the drain of the first NMOS transistor and the input end of the second inverter; the source of the first NMOS transistor is grounded and its gate is connected to the reset signal. The output end of the second inverter is connected to one end of the second transmission gate and the other end is connected to the input end of the third inverter. The output VOUT of the third inverter is an output signal for the D triggers DFF1.

Further, the D trigger DFF2 includes a second OR gate, a fourth inverter, a fifth inverter, a sixth inverter, a seventh inverter, an eighth inverter, a ninth inverter, a second NMOS transistor, a third transmission gate, a fourth transmission gate and a fifth transmission gate, wherein the input end of the second OR gate is connected to the clock signal, a latch signal and a reset signal and its output end is connected to the input end of the fourth inverter, the latch signal is connected to the input end of the fifth inverter, the output ends of the second OR gate and the fourth inverter are respectively connected to two control ends of the third and fourth transmission gates. The latch signal and the output end of the fifth inverter are connected to two control ends of the fifth transmission gate. The input signal of the D triggers DFF2 is connected to one end of the third transmission gate, the other end of the third transmission gate is connected to the drain of the second NMOS transistor, the input end of the sixth inverter and one end of the fifth transmission gate. The source of the second NMOS transistor is grounded and the gate of the second NMOS transistor is connected to the reset signal, the output end of the sixth inverter is connected to one end of the fourth transmission gate, the other end of the fourth transmission gate is connected to the input end of the seventh inverter. The output VOUT of the seventh inverter works as an output signal of the D triggers DFF2. Meanwhile, the drain of the second NMOS transistor, being connected to the fifth transmission gate, is the input end of the eighth and ninth inverters in series, and output ends of the two inverters in series are connected to the other end of the fifth transmission gate.

Further, the high-speed successive approximation analog-to-digital converter of two bits per cycle further includes an OR gate, wherein one end of the OR gate is connected to the sampling signal Clks, and the other end of the OR gate is connected to an output end Q of the last D trigger DFF1 and a latch end L of the last D trigger DFF2.

Further, each of the switch array SW1 and switch array SW2 includes multiple groups of switches. Each group includes two symmetrical switch capacitor units, and each switch capacitor unit includes an NAND gate, an AND gate, a tenth inverter, an eleventh inverter and a twelfth inverter. One input end of the NAND and the AND gate are connected to a clock signal Clki, the output signal CODEM(P) of encoding circuit is connected to the input end of the tenth inverter and the input end of the AND gate. The output end of the tenth inverter is connected to another input end of the NAND gate, an output end of the NAND gate is connected to an input end of the eleventh inverter, an output end of the AND gate is connected to an input end of the twelfth inverter, and output ends of the eleventh and twelfth inverter are respectively connected to one plate of each of two same capacitors.

DETAILED DESCRIPTION OF THE INVENTION

The embodiments of the present invention are described in detail and illustrated with attached drawings. It should be understand the following embodiments are only intended to illustrate the invention, not to limit the claims.

Figure 1:
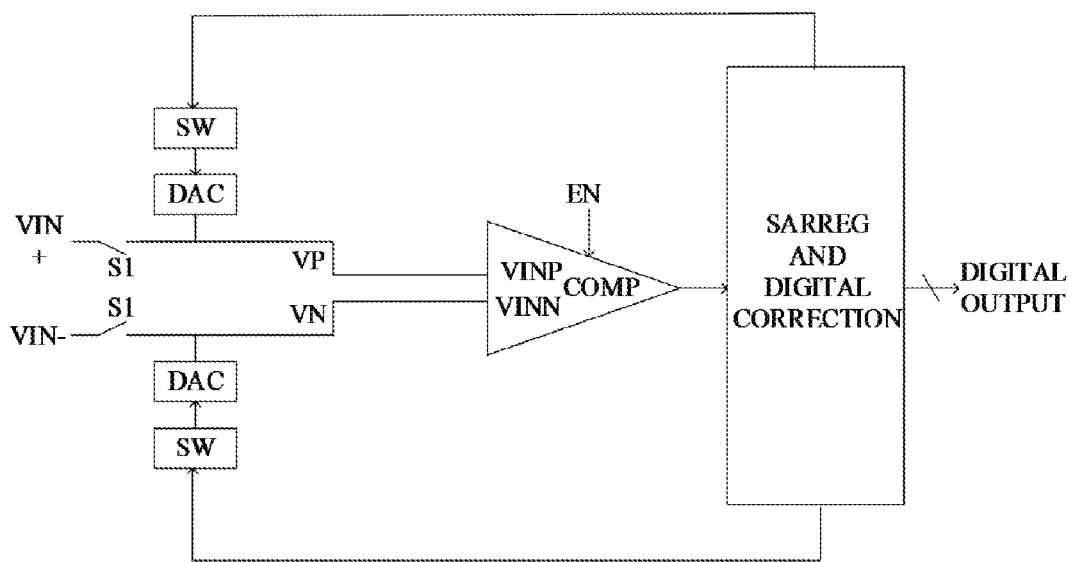
FIG. 1 is a schematic diagram of a traditional successive approximation analog-to-digital converter of one bit per cycle.
Figure 2:
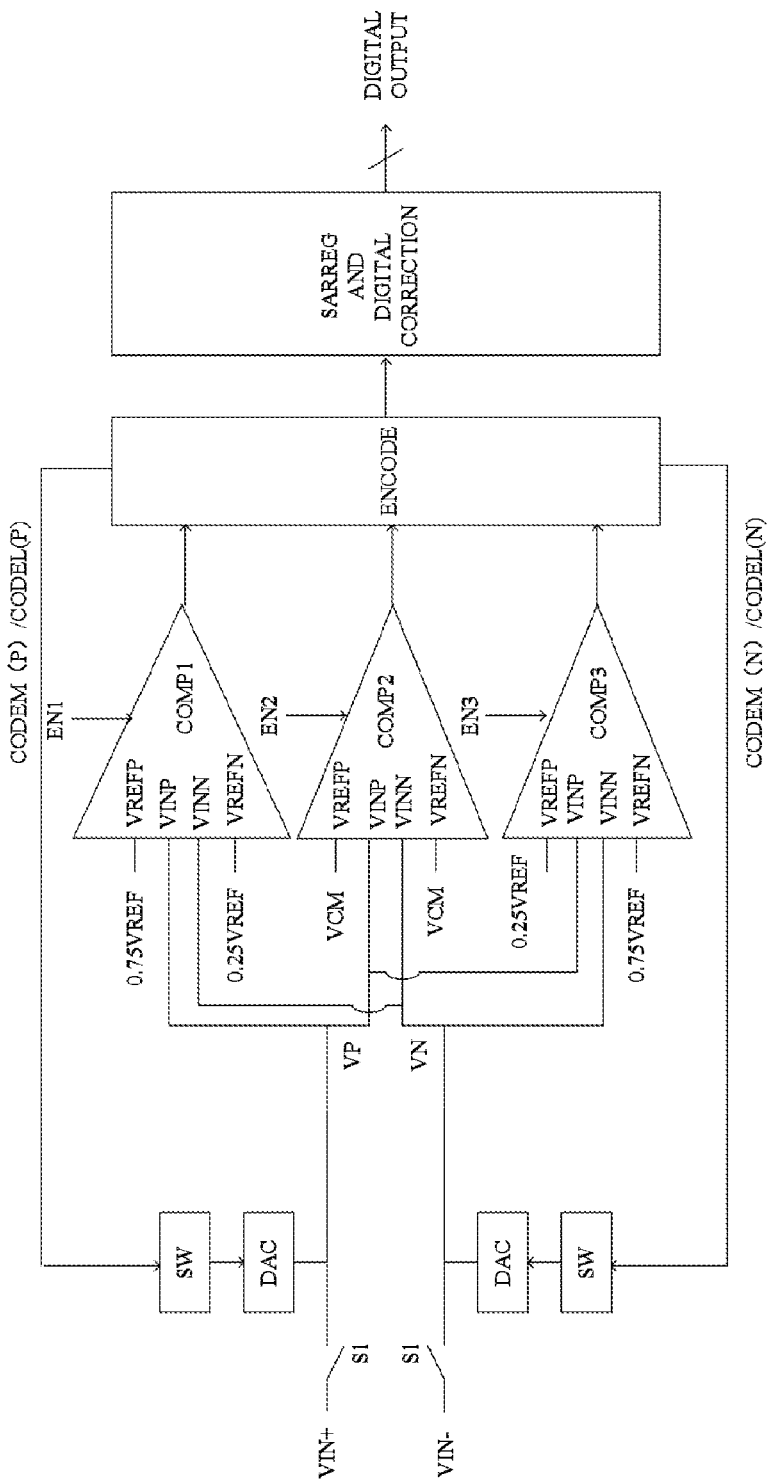
FIG. 2 is a schematic diagram of a traditional successive approximation analog-to-digital converter of two bits per cycle.
Figure 3:
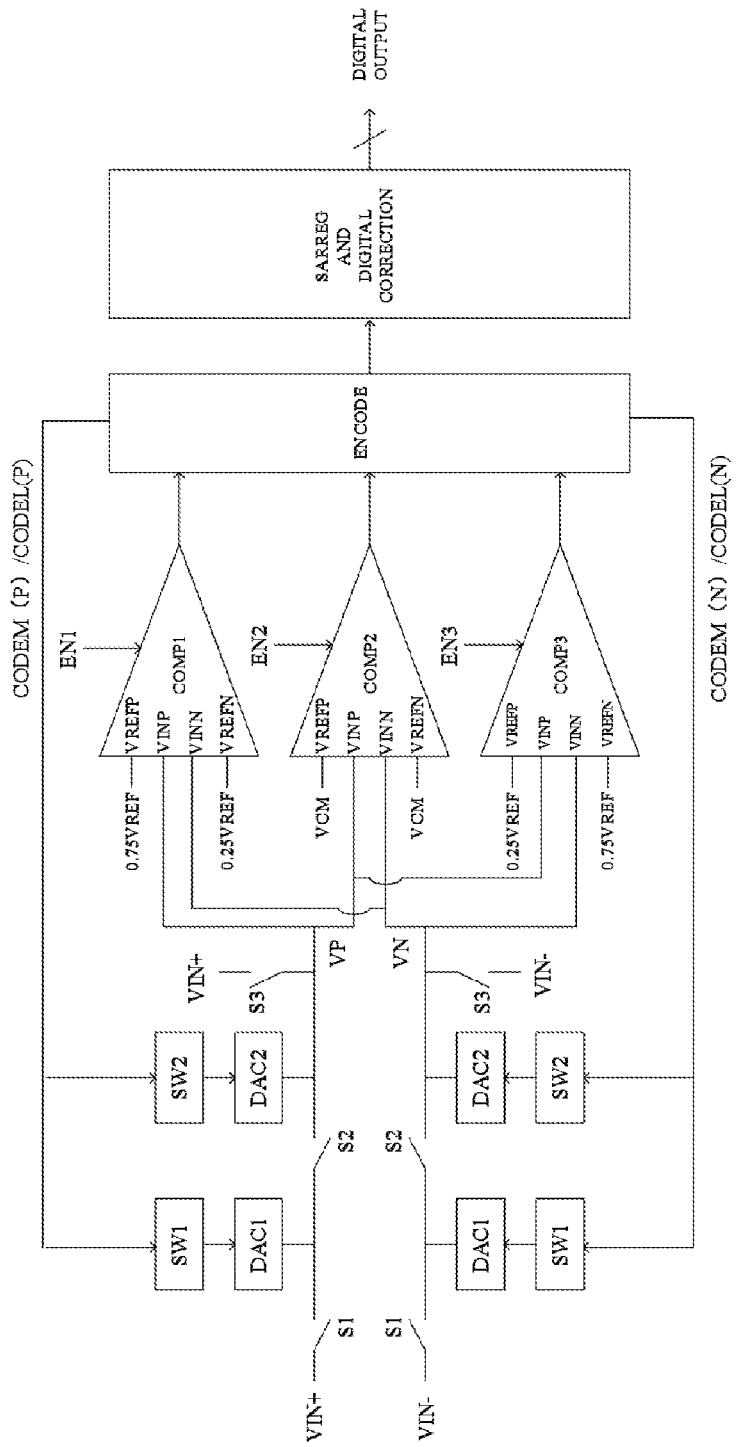
FIG. 3 is a schematic diagram of a high-speed successive approximation type analog-to-digital converter of two bits per cycle provided by the present invention.

As shown in FIG. 3, the present invention provides a high-speed successive approximation analog-to-digital converter of two bits per cycle. The converter includes sampling switches S1 and S3, a switch S2, capacitor arrays DAC1 and DAC2, a switch array SW1 corresponding to the capacitor array DAC1, a switch array SW2 corresponding to the capacitor array DAC2, comparators COMP1, COMP2 and COMP3, an encoding circuit ENCODE, as well as a shift register and a digital correction unit SARREG AND DIGITAL CORRECTION.

The switch S2, the sampling switch S1, and the sampling switch S3 are turned on according to a sampling signal. When a high bit large capacitor is established, the switches S1 and S3 remain turned off and the switch S2 is turned on again.

When a circuit is at a sampling stage and the switches S1, S2 and S3 are turned on simultaneously, the capacitor arrays DAC1 and DAC2 are used to simultaneously sample input signals VIN+ and VIN− with sampling plates thereof. When the high-bit large capacitor is established, non-sampling plates of capacitors of the capacitor array DAC2 are reset to enter the sampling stage and capacitors of the capacitor array DAC1 remain connected to a corresponding reference voltage to restart a successive approximation process.

When the sampling stage ends and the switches S1, S2 and S3 are turned off, the comparators COMP1, COMP2 and COMP3 are used to compare a difference between voltages VP and VN on sampling plates of the capacitor arrays DAC1 and DAC2 with three reference voltages. And each of three comparators outputs a three-bit thermometer code after each comparison.

The encoding circuit is used to convert a three-bit thermometer code into a two-bit binary code to output a two-bit digital code each comparison period.

The switch array SW1 corresponding to the capacitor array DAC1 and the switch array SW2 corresponding to the capacitor array DAC2, are used to simultaneously and progressively connect reference voltages to the corresponding two-bit capacitors of capacitor arrays DAC2 and DAC1 in a sequence from the highest bit to the lowest one. As soon as all the capacitors of the capacitor array DAC2 are connected to the corresponding reference voltages, and all the capacitors of the capacitor array DAC1 are connected to a corresponding reference, at the same time, the high bit large capacitor is established.

The shift register and the digital correction unit is used to rearrange and output two-bit digital codes in parallels during each comparison period.

The successive approximation type analog-to-digital converter of two bits per cycle features two times speed than a traditional one of one bit per cycle structure. Compared with a conventional successive approximation analog-to-digital converter of two bits per cycle, the novel converter in the invention can proceed with a successive approximation process without any redundancy bit capacitor being used to compensate incomplete establishment of pre-stage large capacitor. No fault occurs as the way it goes above. Meanwhile, the encoding circuit is used to convert a thermometer code into a binary code effectively. And the inherent comparator error can be reduced by randomly gating three comparators.

As shown in FIG. 3, the high-speed successive approximation analog-to-digital converter of two bits per cycle works as follows: when a circuit is at a sampling stage, the switches S1, S2 and S3 are simultaneously turned on, sampling plates of the capacitor array DAC1 and sampling plates of the capacitor array DAC2 are used to sample signals simultaneously, where DAC1 is a high-bit capacitor array and DAC2 is a low-bit capacitor array, and the comparators COMP1, COMP2 and COMP3 stay an offset-calibration stage. After sampling, the switches S1, S2 and S3 are turned off simultaneously, the comparators COMP1, COMP2 and COMP3 start working simultaneously, a thermometer code, as output of three comparators, is converted into a binary code by the encoding circuit ENCODE. In this way, the circuit outputs a two-bit digital code every comparison period. Each two-bit digital code is used to progressively control connections between capacitors of the capacitor array DAC2 from a highest bit to a lowest bit and the corresponding reference voltages, as well as connections between those of the capacitor array DAC1 and the corresponding reference voltages. As soon as capacitors of the capacitor array DAC2 are connected to the corresponding reference voltages, and the capacitors of the capacitor array DAC1 are connected to the corresponding reference voltages, the high-bit large capacitor is established at the same time. The switch S1 and S3 remain turned off. The switch S2 is turned on again. Meanwhile, non-sampling plates of capacitors of the capacitor array DAC2 are reset as state of sampling, i.e. the plates are connected to common-mode voltage VCM, and capacitors of DAC1 remain being connected to the corresponding reference voltages. Then the circuit works to restart successive approximation process in ways that go through an entire successive approximation. Compared with the traditional successive approximation analog-to-digital converter of one bite per cycle, the converter in the present invention features high speed and is used to solve the problem of long settling time of high-bit large capacitor. The comparison result of low-bit capacitor is used to control the high-bit capacitor. When the high-bit capacitors are settling, the low-bit capacitors proceed with the successive approximation process. Compared with the traditional successive approximation analog-to-digital converter of two bits per cycle, the present invention shortens a conversion time and improves the operation speed of the successive approximation analog-to-digital converter since there is no need to either wait for the complete establishment of the high-bit capacitor or add the redundancy bit capacitor to compensate for the impact resulting from incomplete establishment in the previous stage. Meanwhile, randomly gating three comparators COMP1, COMP2 and COMP3 can be used to reduce the system error of the analog-to-digital converter.

As an embodiment shown in FIG. 3, the capacitor array DAC1 is a high-bit capacitor array including N capacitors in parallel, wherein, N is an even number, N capacitors from the highest bit to the lowest bit are expressed as: $2^{(2N-1)}C$, $2^{(2N-3)}C, \ldots, 2^{(N+1)}C, 2^N C$, and C is a capacitance value of a unit capacitance. The capacitor array DAC2 is a low-bit capacitor array comprising N+1 capacitors in parallel, wherein the N+1 capacitors from the highest bit to the lowest bit are expressed as: $2^{(N-1)}C, 2^{(N-2)}C, \ldots, 2C, C, C$. The non-sampling plate of the lowest-bit capacitor in the capacitor array DAC2 is connected to a common-mode voltage VCM all the time.

As an embodiment shown in FIG. 3, the sampling plates of the capacitor array DAC1 and the capacitor array DAC2 are controlled by the sampling switches S1 and S3. The switch S2 is used to connect the sampling plate of the capacitor array DAC1 to the sampling plate of the capacitor array DAC2. Specifically, when the circuit is in sampling state, the switches S1, S2 and S3 are turned on at the same time, and the sampling plates of the capacitor array DAC1 and the sampling plates of the capacitor array DAC2 sample simultaneously. When the establishment of the high-bit large capacitor of the capacitor array DAC1 is completed, the switches S1 and S3 remain turned off, the switch S2 is turned on again, the sampling plates of the capacitor array DAC1 and DAC2 are connected to each other. Meanwhile, the non-sampling plates of capacitors of the capacitor array DAC2 are reset at the sampling state, i.e. capacitors of the capacitor array DAC2 are connected to common-mode voltage VCM, and the capacitors of DAC1 keep a previous state, being connected to the corresponding reference voltages. Then the circuit starts the successive approximation process again in a way that completes a whole successive approximation period.

Figure 11:
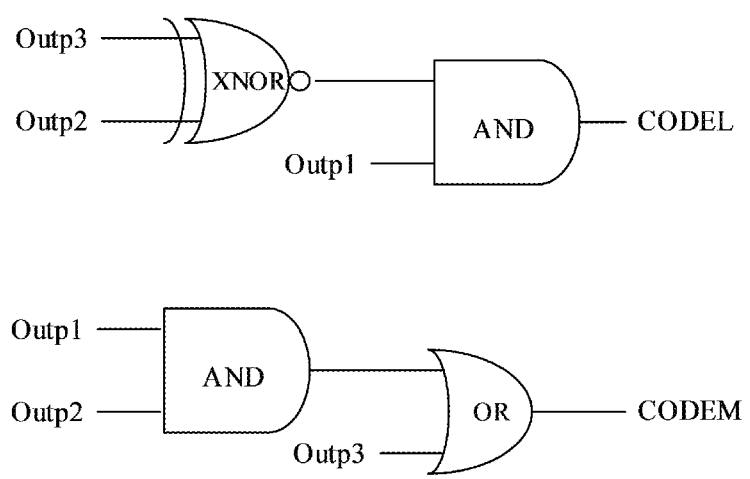
FIG. 11 is a schematic diagram of an encoding circuit in FIG. 3.

As an embodiment, a circuit diagram of encoding circuit is shown in FIG. 11. The encoding circuit includes a low-bit digital code generator and a high-bit digital code generator. The low-bit digital code generator includes an XNOR gate and an AND gate, two input ends of the XNOR gate are connected to positive output ends of the comparator COMP2 and the comparator COMP3. Two input ends of AND gate are connected to an output end of the XNOR gate and a positive output end of the comparator COMP1. An output end of the AND gate is used to generate a lower bit of the two-bit digital code, noted as CODEL. The high-bit digital code generator includes an AND gate and an OR gate. Two input ends of the AND gate are connected to the positive output ends of the comparator COMP1 and COMP2. Two input ends of the OR gate are connected to an output end of the AND gate and the positive output end of the comparator COMP3. An output end of the OR gate generates a higher bit, recorded as CODEM Meanwhile, Table 1 is showing the truth value of the encoding circuit.

TABLE 1

| Outp3 | Outp2 | Outp1 | CODEM | CODEL |
| --- | --- | --- | --- | --- |
| 0 | 0 | 0 | 0 | 0 |
| 0 | 0 | 1 | 0 | 1 |
| 0 | 1 | 1 | 1 | 0 |
| 1 | 1 | 1 | 1 | 1 |

Figure 4:
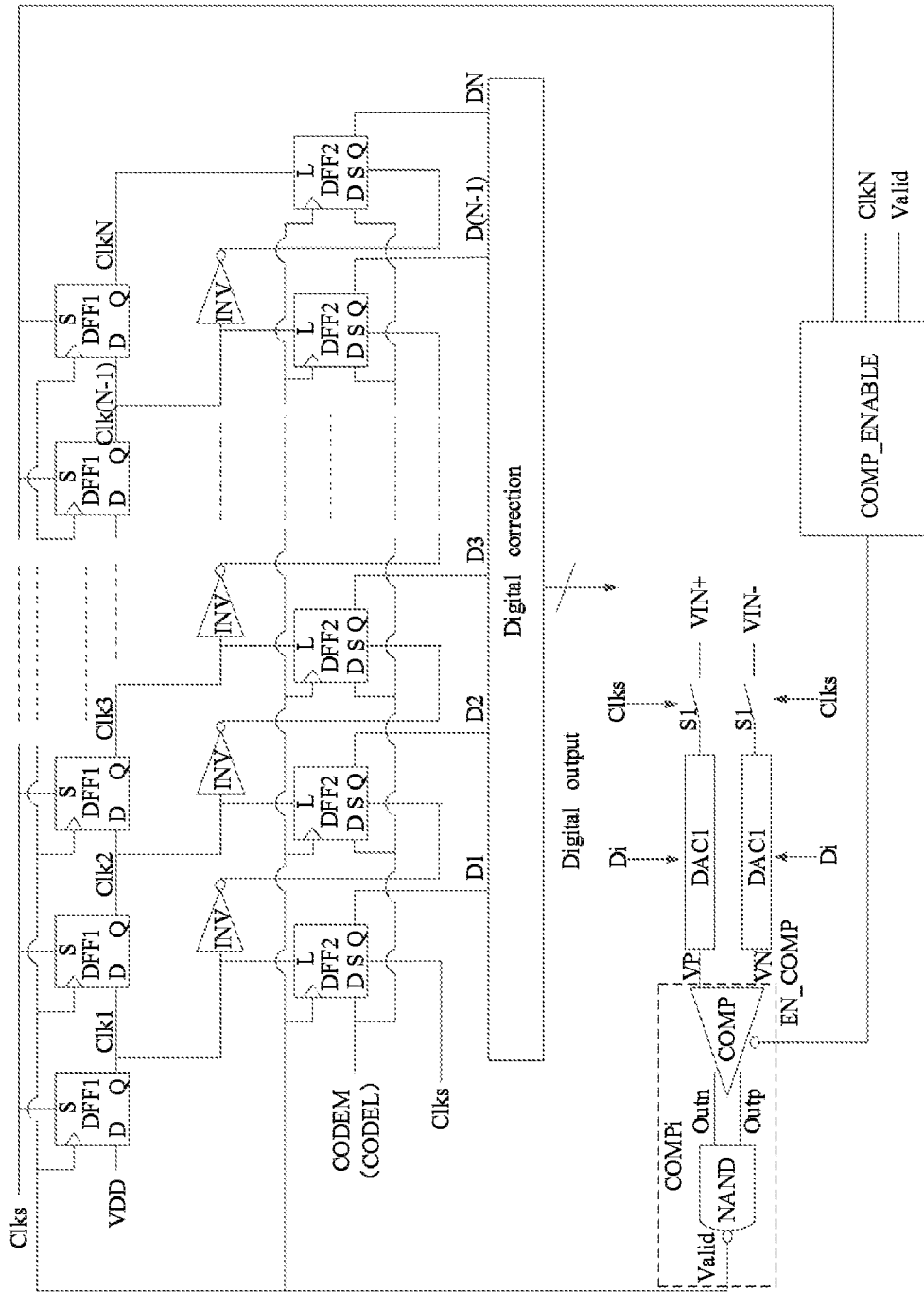
FIG. 4 is a schematic diagram of a working principle related to a capacitor array DAC1 in FIG. 3.

A working principle of a control module for the capacitor array DAC1 and the capacitor array DAC2 are illustrated below. A working principle related to the capacitor array DAC1 is as shown in FIG. 4 with only one comparator as an example. Regarding the D triggers DFF1 and DFF2, when the reset end S is at a high level, the output end Q is set as a low level which is irrelevant to an input clock and an input value of a D end. Regarding the D trigger DFF2, when an L end is at a high level, a value of the output end Q is latched which is irrelevant to the input clock and the input value of the D end. It is noted that S end and L end cannot be at the high level at the same time for the D trigger DFF2. When an enabling signal EN_COMP generated by a comparator enabling unit COMP_ENABLE is a low level, the comparator COMPi is at a working state. When the enabling signal EN_COMP is a high level, the comparator COMPi is at reset state, wherein both outputs Outp and Outn of the comparator are high level. As a particular embodiment, the analog-to-digital converter includes an NAND gate being connected to the output end of each comparator COMP. That is to say, the outputs Outp and Outn of the comparator COMP are connected to the input of the NAND gate which outputs an output signal Valid. The signal Valid is taken as a clock signal for the D trigger DFF1 and the D triggers DFF2.

As a particular embodiment, the shift register includes N D triggers DFF1, N−1 inverters and N D triggers DFF2, wherein N is a positive integer no less than 3, the clock signal Valid is connected to a clock end of each D trigger DFF1, reset ports S of the first to the $N^{th}$ D triggers DFF1 are connected to a sampling signal Clks, an input end D of the first D trigger DFF1 is connected to a power supply VDD.

An output end Q of each D trigger DFF1 is connected to an input end D of the next D trigger DFF1 thereof in sequence, output ends Q from the first to the $N^{th}$ D triggers DFF1 respectively output first output signals Clk1 to ClkN, the output ends Q from the first to the Nth D triggers DFF1 are correspondingly connected to input ends of the first to the $(N-1)^{th}$ inverters in sequence, and an output end of each inverter is connected to a reset end S of the corresponding D trigger DFF2 thereof in sequence; and latch ends L of the first to the $N^{th}$ D triggers DFF2 are correspondingly connected to the output ends Q of the first to the $N^{th}$ D triggers DFF1, a reset end S of the first D trigger DFF2 is connected to a sampling signal Clks, output ends of the first to the $(N-1)^{th}$ inverters are correspondingly connected to reset ends S of the second to the $N^{th}$ D triggers DFF2, the output ends of the comparators are connected to the input end of each D trigger DFF2, the clock signal Valid is connected to a clock end of each D trigger DFF2, and output ends of the first to the $N^{th}$ D triggers DFF2 output second output signals D1 to DN in sequence.

Figure 5:
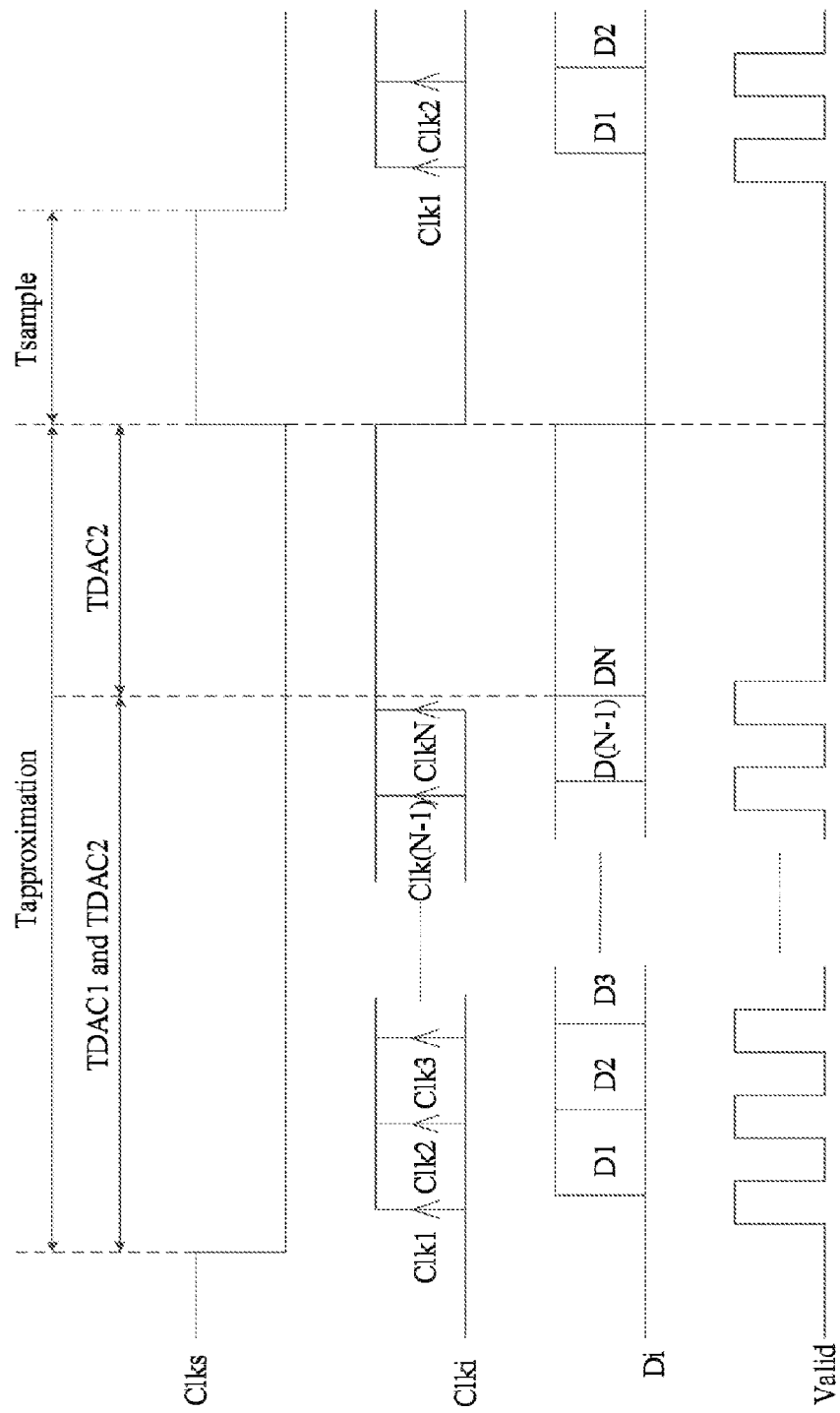
FIG. 5 is a schematic diagram of a working time sequence related to the capacitor array DAC1 in FIG. 3.

Specifically, when the analog-to-digital converter ADC is at a sampling stage, a sampling signal Clks is a high level, the output end Q of all the D triggers DFF1 in FIG. 4 are set to be 0. At the same time, the output end Q of all the D triggers DFF2 are set to be 0. When the sampling is completed, the sampling signal Clks changes to be a low level, all the D triggers DFF1 and the D triggers DFF2 corresponding to the second output signal D1 quit the set state. The rest D triggers DFF2 keep the set state. At the time, the comparators are enabled to start a first comparison by the comparator enabling unit COMP_ENABLE. When comparators complete the first comparison, the clock signal Valid triggers the un-reset D triggers DFF1 and DFF2. The first output signal Clk1 turns into a high level from a low level, first output signals Clk2 to ClkN remain at low level. And first comparison result CODEM (CODEL) is output as the second output signal D1. As the first output signal Clk1 is a high level, the D trigger DFF2 corresponding to the second output signal D1 is latched-off, the D trigger DFF2 corresponding to the second output signal D2 quit the set state, the rest D triggers DFF2 remain in the set state. By the time, the first working period is completed. Then, the comparator enabling unit COMP_ENABLE enables the comparators start a second comparison. The clock signal Valid triggers the un-reset or latched-off D trigger DFF1 and DFF2. The first output signal Clk1 is a high level. The first output signal Clk2 turns a high level from a low level, and first output signals Clk3 to ClkN keep low level. Meanwhile, a second comparison result CODEM (CODEL) is output as the second output signal D2, the value of second output signal D1 is invariant due to latch-up effect. Then as the first output signal Clk2 is a high level, D trigger DFF2 corresponding to the second output signal D2 is latched, D trigger DFF2 corresponding to the second output signal D3 quits the reset state, the rest D triggers DFF2 remain either reset state or latch-up state. By the time, the second working period is completed. The circuit works in the same manner as shown in FIG. 5.

Figure 6:
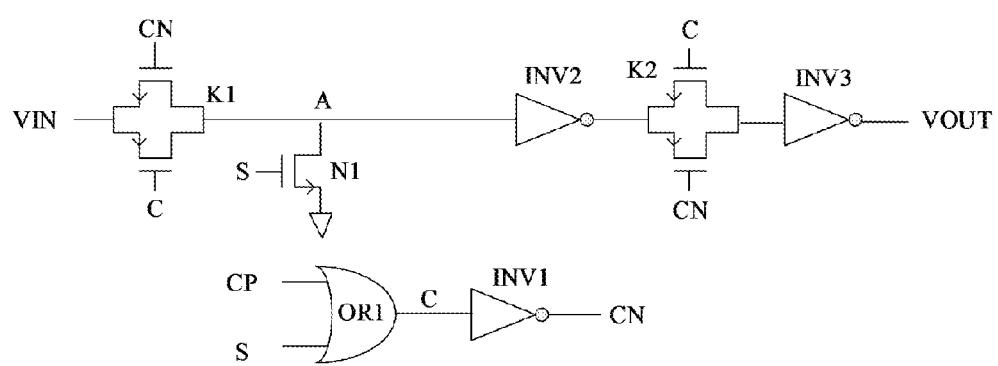
FIG. 6 is a schematic diagram of a D trigger DFF1 provided by the present invention.

As a particular embodiment as shown in FIG. 6, the D trigger DFF1 includes a first OR gate OR1, a first inverter INV1, a second inverter INV2, a third inverter INV3, a first NMOS transistor N1, a first transmission gate K1, and a second transmission gate K2, wherein the input end of the first OR gate OR1 is connected to a clock signal CP and a reset signal S (i.e., a sampling signal Clks) and its output end is connected to the input end of the first inverter INV1. The output end of the first OR gate OR1 and the output end of the first inverter respectively generate signals C and CN. The signals C and CN are respectively connected to control ends of the first and second transmission gates K1 and K2 as control signals. The input signal VIN of the D trigger DFF1 is connected to one end of the first transmission gate K1, the other end of the first transmission gate K1 is connected to the drain of the first NMOS transistor N1 and the input end of the second inverter INV2. The source of the first NMOS transistor N1 is grounded and the gate of the the first NMOS transistor N1 is connected to the reset signal S. The output end of the second inverter INV2 is connected to one end of the second transmission gate K2 and the other end is connected to the input end of the third inverter INV3. The output VOUT of the third inverter INV3 is an output signal of the D triggers DFF1.

Figure 7:
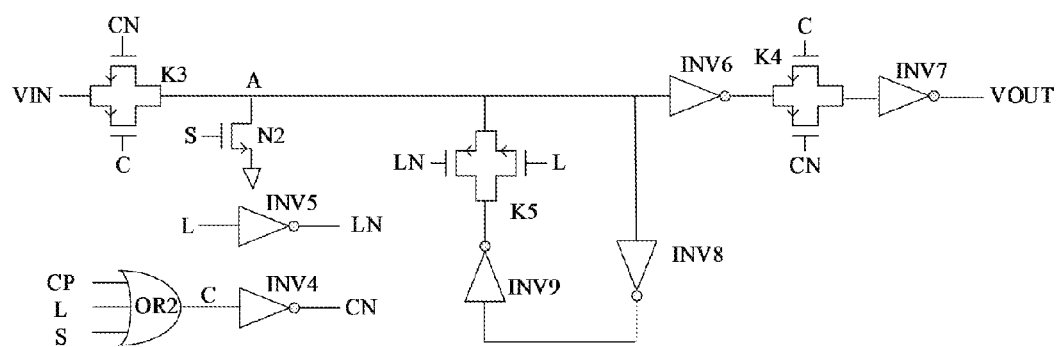
FIG. 7 is a schematic diagram of a D trigger DFF2 provided by the present invention.

As a particular embodiment shown in FIG. 7, the D trigger DFF2 includes a second OR gate OR2, a fourth inverter INV4, a fifth inverter INV5, a sixth inverter INV6, a seventh inverter INV7, an eighth inverter INV8, a ninth inverter INV9, a second NMOS transistor N2, a third transmission gate K3, a fourth transmission gate K4 and a fifth transmission gate K5. The input end of the second OR gate OR2 is connected to the clock signal CP, a latch signal L and a reset signal S. The output end of the second OR gate OR2 is connected to the input end of the fourth inverter INV4. The latch signal L is connected to the input end of the fifth inverter INV5. The output end of the second OR gate OR2 and the output end of fourth inverter INV4 generate signals C and CN. The signals C and CN are respectively connected to control ends of the third transmission gate K3 and the fourth transmission gate K4 as control signals. The control signal LN and the latch signal L from the output end of the fifth inverter INV5 are connected to two control ends of the fifth transmission gate K5 as control signals. An input signal VIN of the D trigger DFF2 is connected to one end of the third transmission gate K3. The other end of the third transmission gate K3 is connected to the drain of the second NMOS transistor N2. The input end of the sixth inverter INV6 and one end of the fifth transmission gate K5. The source of the second NMOS transistor N2 is grounded and the gate of the second NMOS transistor N2 is connected to the reset signal S. An output end of the sixth inverter INV6 is connected to one end of the fourth transmission gate K4. The other end of the fourth transmission gate K4 is connected to an input end of the seventh inverter INV7. An output VOUT of the seventh inverter INV7 works as an output signal of the D triggers DFF2. At the same time, the end being connected to both of the drain of the second NMOS transistor N2 and one end of the fifth transmission gate K5 is an input end of the eighth and ninth inverters INV9 in series. Output ends of the two inverters INV8 and INV9 in series are connected to the other end of the fifth transmission gate K5.

Figure 8:
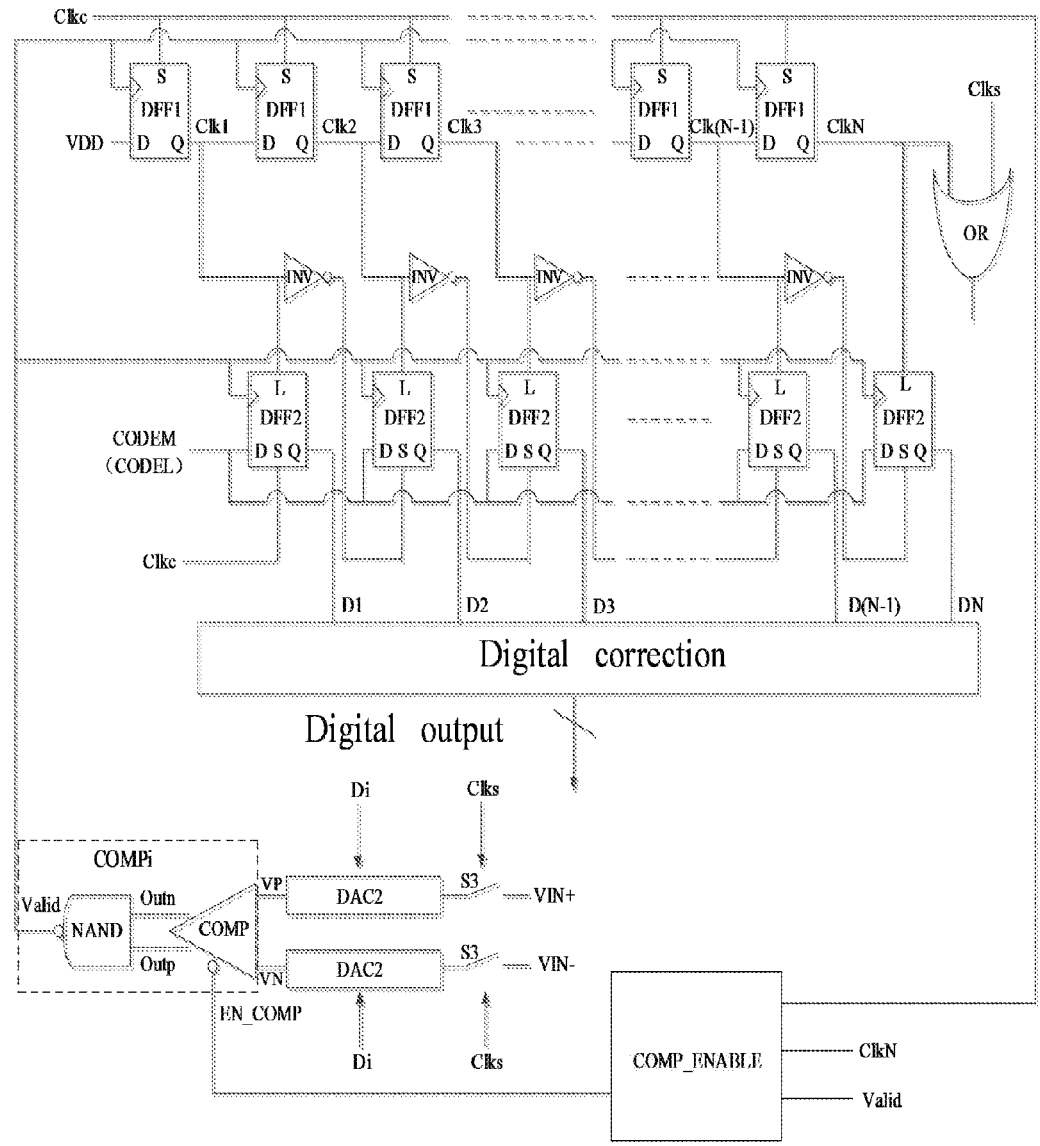
FIG. 8 is a schematic diagram of a working principle related to a capacitor array DAC2 in FIG. 3.
Figure 9:
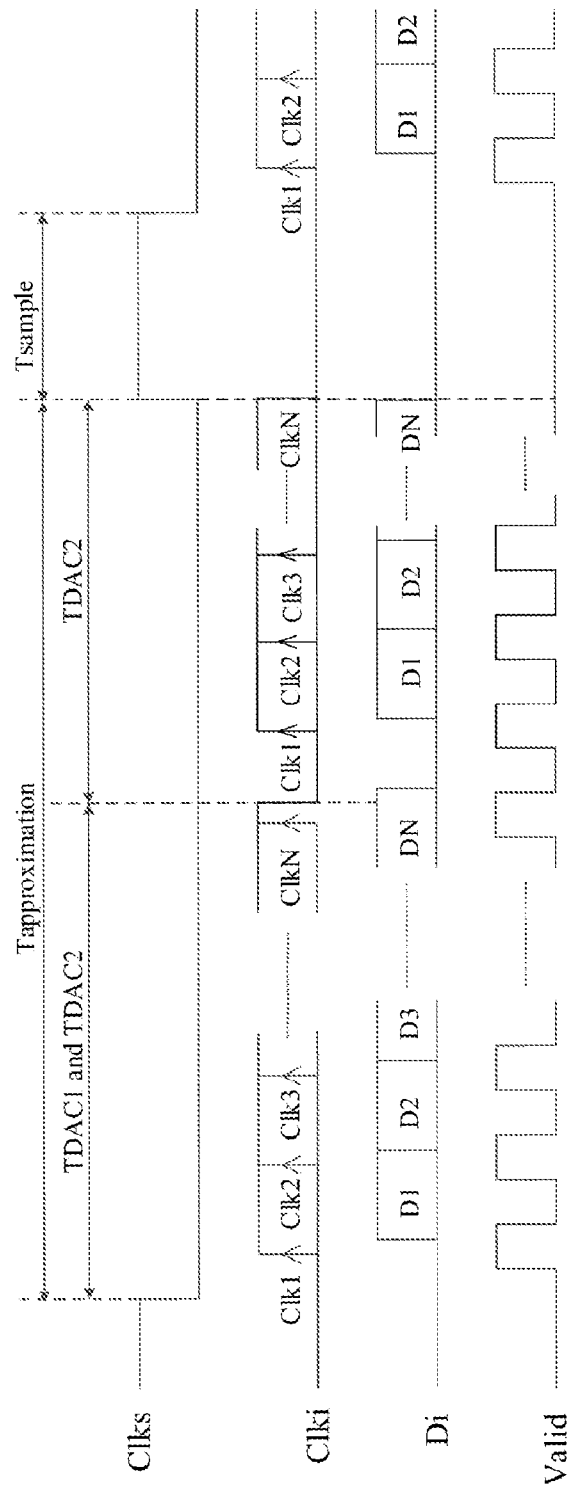
FIG. 9 is a schematic diagram of time sequence related to the capacitor array DAC2 in FIG. 3.

As a particular embodiment shown in FIG. 8, the analog-to-digital converter features an OR gate OR with one input end being connected to the sampling signal Clks and the other input end being connected to the output end Q of the last D trigger DFF1 and the latch end L of the last D trigger DFF2. The operation principle of capacitor array DAC2 is shown in FIG. 8. A difference between FIG. 8 and FIG. 4 is illustrated as follows: as shown in FIG. 4, when the first output signal ClkN changes into a high level, the whole module stays holding state till the next sampling signal Clks; whereas in FIG. 8, as soon as the first output signal ClkN changes into a high level, the D triggers DFF1 and DFF2 are reset by a reset signal Clkc due to the OR gate OR and immediately starts the next conversion process, in a way that realizes the foregoing working principle as described. The time diagram corresponding to FIG. 8 is shown in FIG. 9, wherein TDAC1 and TDAC2 represent the conversion time for the capacitor arrays DAC1 and DAC2 respectively.

Figure 10:
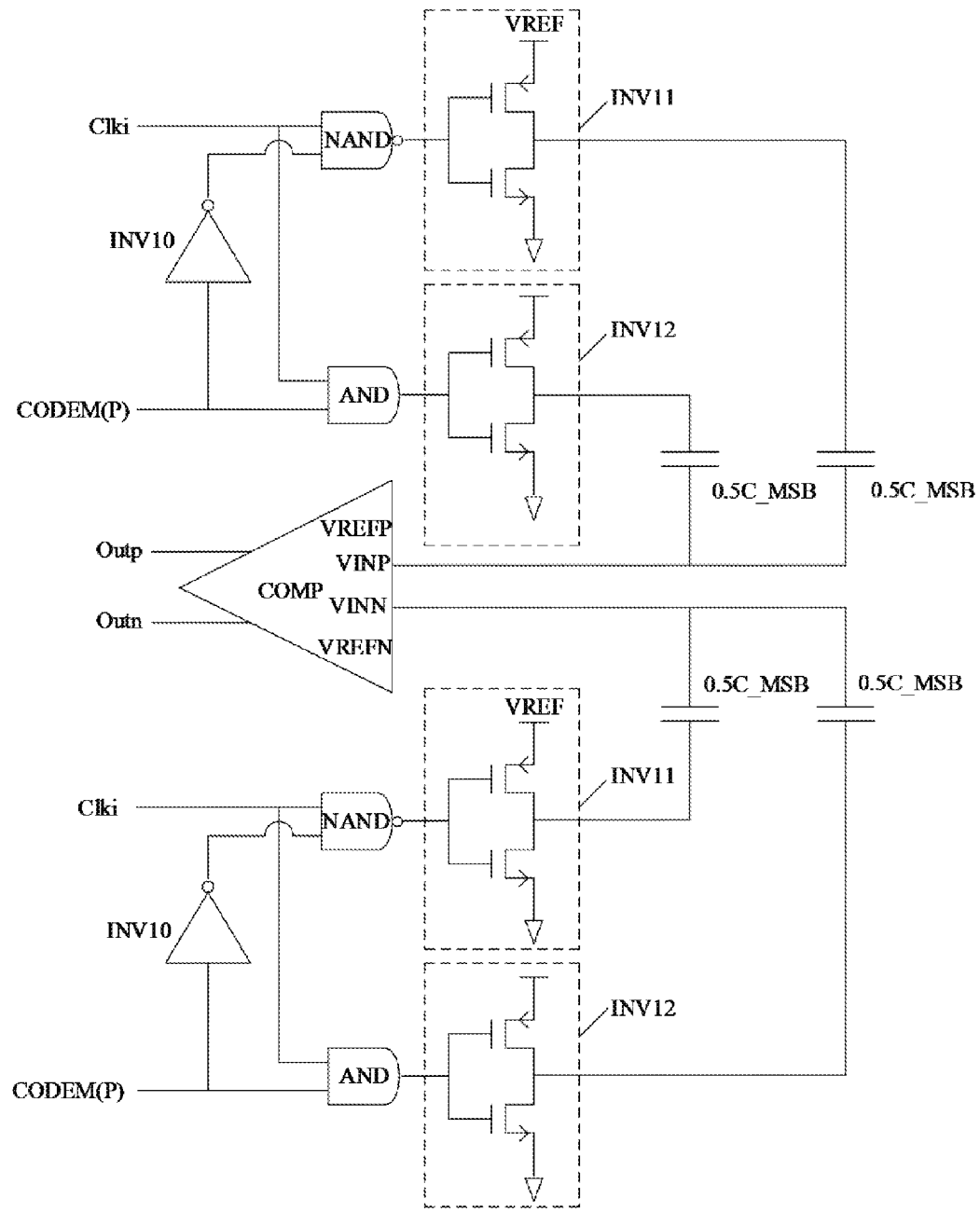
FIG. 10 is a schematic diagram of a switched capacitor unit provided by the present invention.

As a particular embodiment as shown in FIG. 10, both switch array SW1 and switch array SW2 include multiple groups of switches, each group comprises two symmetrical switch capacitor units, and each switch capacitor unit comprises an NAND gate, an AND gate, a tenth inverter, an eleventh inverter and a twelfth inverter. One input end of the NAND and the AND gate are connected to a clock signal Clki, the output signal CODEM(P) of encoding circuit is connected to the input end of the tenth inverter INV10 and the input end of the AND gate. The output end of the tenth inverter INV10 is connected to another input end of the NAND gate NAND, an output end of the NAND gate NAND is connected to an input end of the eleventh inverter INV11, an output end of the AND gate is connected to an input end of the twelfth inverter INV12, and output ends of the eleventh and twelfth inverter INV11 and INV12 are respectively connected to one plate of each of two same capacitors. The other plates of two same capacitors are connected to one input end of comparators COMP. Meanwhile, the two same capacitors constitute a capacitor representing a one-bit weight. FIG. 10 is showing the working principle of switch capacitor, wherein, when the clock signal Clki (i is an integer from 1 to N) is low level, the eleventh inverter INV11 corresponding to the NAND gate NAND outputs a low level (a negative reference), a twelfth inverter INV12 corresponding to the AND gate AND outputs a high level (a negative reference). By the time, a one-bit weight capacitor, comprising two same capacitors, has a non-sampling plate as the same as being connected to a common-mode voltage; and when the clock signal Clki (i is an integer from 1 to N) changes from a low level to a high level, the encoding circuit generates a corresponding signal CODEM (P): if the signal CODEM(P) is a high level, the non-sampling plate of the one-bit weight capacitor is equivalent to being connected to a low level (a negative reference), otherwise, a high level (a negative reference). As the signal CODEM(P) through the encoding circuit, the other plate is an opposite polarity signal, the non-sampling plate of the one-bit weight capacitor is equivalent to being connected to a high level (a negative reference), otherwise, a low level (a negative reference).

Embodiment 1

Figure 12:
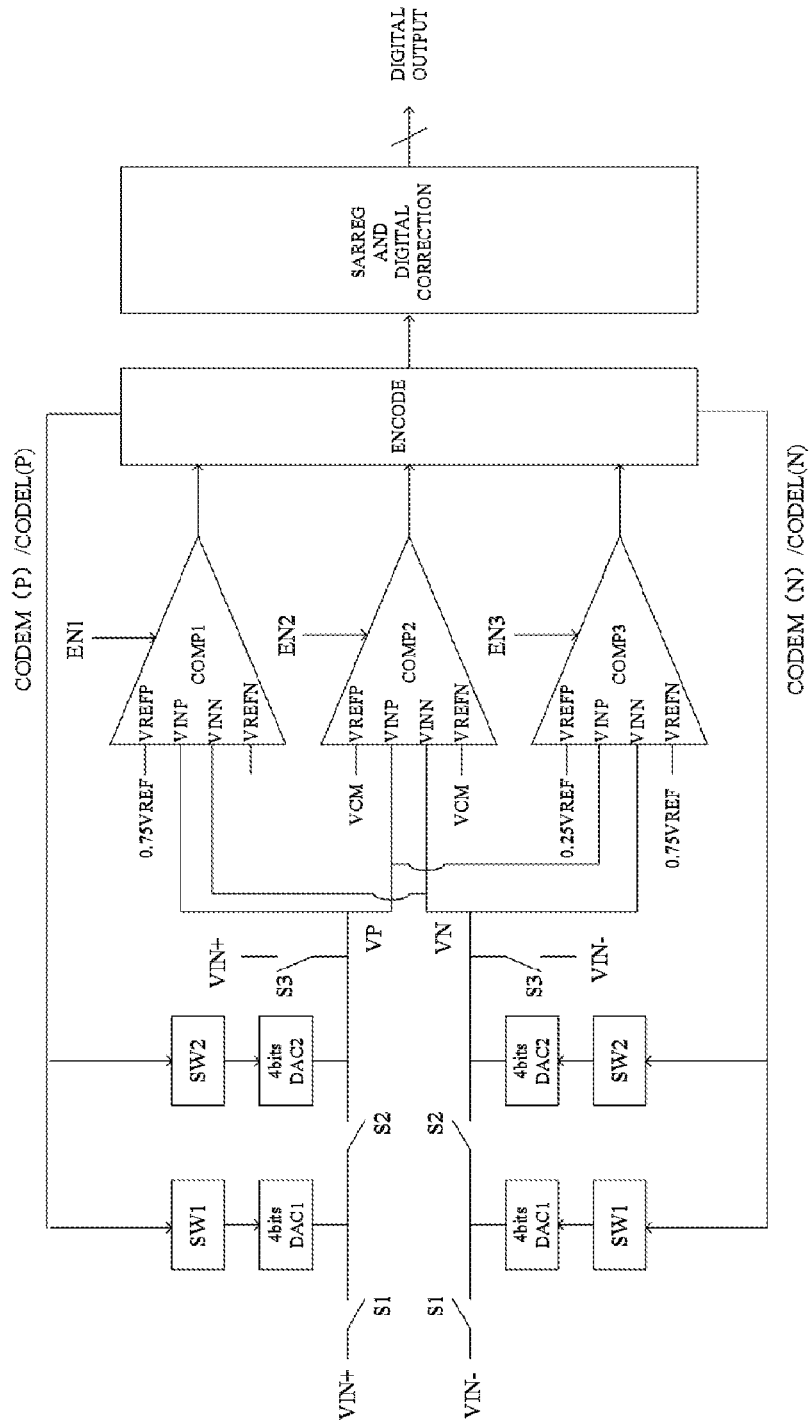
FIG. 12 is a schematic diagram of an embodiment of an eight-bit analog-to-digital converter provided by the present invention.

FIG. 12 is showing a schematic diagram of an eight-bit analog-to-digital converter, wherein both the capacitor array DAC1 and the capacitor array DAC2 employ 4-bit capacitor arrays in a way that realize an 8-bit high-speed successive approximation analog-to-digital converter of 2 bits per cycle and only 4 comparison periods are required for 8-bit successive approximation process.

Embodiment 2

Figure 13:
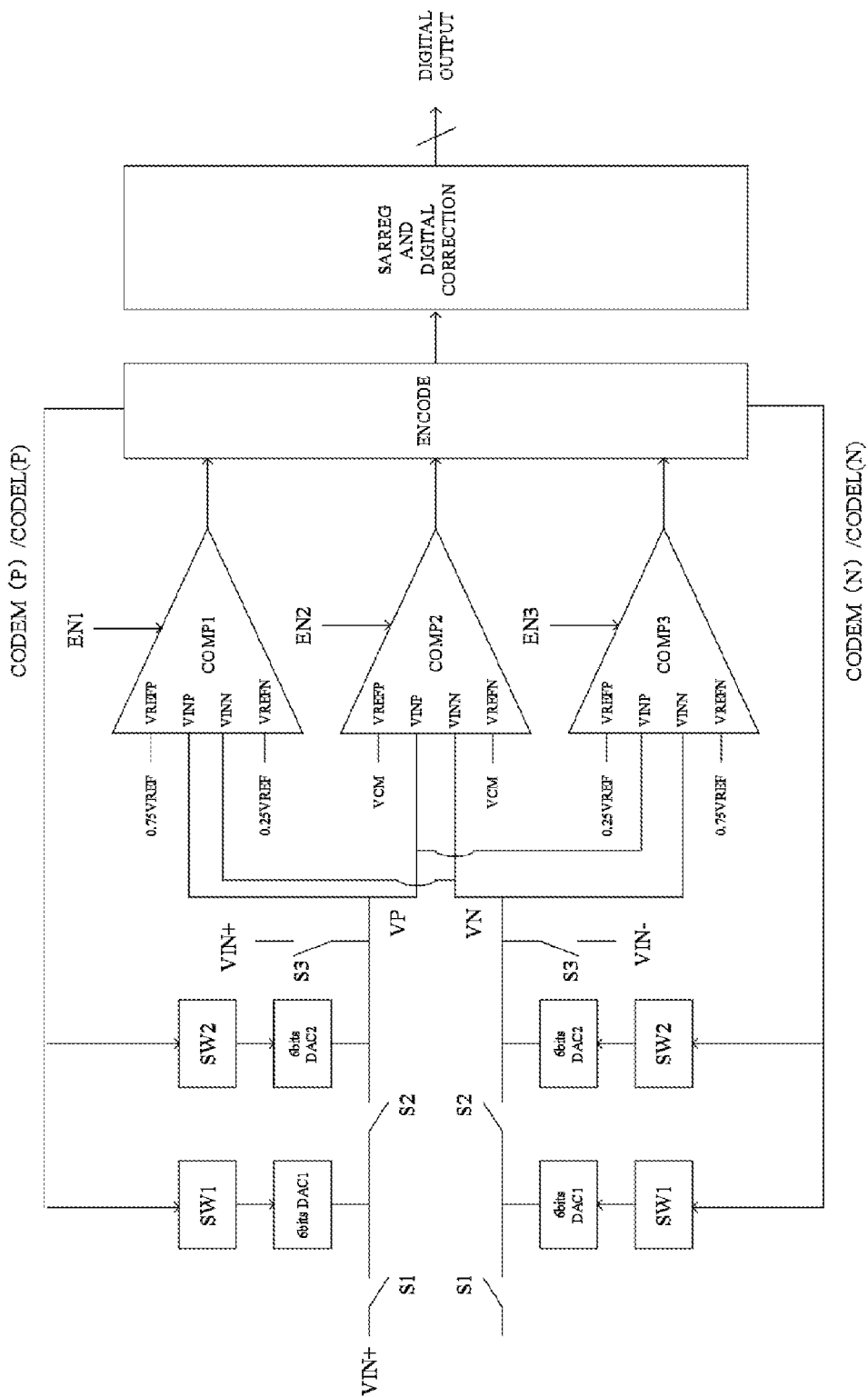
FIG. 13 is a schematic diagram of an embodiment of a twelve-bit analog-to-digital converter provided by the present invention.

FIG. 13 is showing a schematic diagram of a twelve-bit analog-to-digital converter, wherein both the capacitor array DAC1 and the capacitor array DAC2 employs six-bit capacitor arrays in a way that realize twelve-bit high-speed successive approximation analog-to-digital converter of two bits per cycle and only six comparison periods are required for twelve-bit successive approximation process.

The embodiments mentioned above are only for better understanding of the invention, not limit to the foregoing embodiments. The circuit can be realized as the capacitor array DAC1 and DAC2 employ the same number of bits and the number of bits is even.

It should be understood that the embodiments of the present invention is not intended to thereby limit the patent scope of the present invention. Any equivalent structures made by utilizing the specification and accompanying drawings of the present invention and applied to other relevant technical fields directly or indirectly likewise fall under the scope of patent protection of the present invention.

What is claimed is:

1. A high-speed successive approximation analog-to-digital converter of two bits per cycle, comprising:
a first switch, a second switch and a third switch, used to be turned on according to a sampling signal; when a capacitor with high capacitance is settled, the second switch and the third switch remain turned off and the first switch is turned on again;
a first capacitor array and a second capacitor arrays, when the high-speed successive approximation analog-to-digital converter of two bits per cycle is at a sampling stage and the first to third switches are turned on, the first and second capacitor arrays are used to simultaneously sample input signals with sampling plates thereof, when the high-bit large capacitor being settled, non-sampling plates of capacitors of the second capacitor array are reset to enter a sampling stage and capacitors of the first capacitor array remain connected to a corresponding reference voltage to restart a successive approximation process;
a first to third comparators, when the sampling stage ends and the first to third switches are turned off, the first to third comparators are used to compare a difference between voltages on the sampling plates of the first and second capacitor arrays with three reference voltages, and each of the first to third comparators outputs a three-bit thermometer code after each comparison;
an encoding circuit, used to convert a three-bit thermometer code into a two-bit binary code to output a two-bit digital code each comparison period;
a first switch array corresponding to the first capacitor array and a second switch array corresponding to the second capacitor array, used to simultaneously connect the reference voltages to the corresponding two-bit capacitors of the second capacitor array and the first capacitor array in a sequence from a highest bit to a lowest bit, when all the capacitors of the second capacitor array are connected to the corresponding reference voltages and all the capacitors of the first capacitor array are connected to the corresponding reference voltage, at the same time, the high-bit large capacitor is settled; and
a shift register and a digital correction unit, used to rearrange and output the two-bit digital codes in parallels during each comparison period.

2. The high-speed successive approximation analog-to-digital converter of two bits per cycle of claim 1, wherein the first capacitor array is a high-bit capacitor array comprising N capacitors in parallel, wherein N is an even number, the N capacitors from a highest bit to a lowest bit are expressed as: $2^{(2N-1)}C$, $2^{(2N-2)}C$, . . . , $2^{(N+1)}C$, $2^N C$, and C is a capacitance value of a unit capacitance; the second capacitor array is a low-bit capacitor array comprising N+1 capacitors in parallel, wherein the N+1 capacitors from a highest bit to a lowest bit are expressed as: $2^{(N-1)}C$, $2^{(N-2)}C$, . . . , 2C, C, C, and the non-sampling plate of the lowest bit capacitor in the second capacitor array is connected to a common-mode voltage all the time.

3. The high-speed successive approximation analog-to-digital converter of two bits per cycle of claim 1, wherein the sampling plates of the first capacitor array and the second capacitor array are controlled by the first switch and the third switch, the second switch is used to connect the sampling plate of the first capacitor array to the sampling plate of the second capacitor array.

4. The high-speed successive approximation analog-to-digital converter of two bits per cycle of claim 1, wherein the encoding circuit comprises a low-bit digital code generator and a high-bit digital code generator, the low-bit digital code generator comprises an XNOR gate and a first AND gate, two input ends of the XNOR gate are connected to positive output ends of the second comparator and the third comparator, two input ends of the first AND gate are connected to an output end of the XNOR gate and a positive output end of the first comparator, an output end of the first AND gate is used to generate a lower bit of the two-bit digital code; the high-bit digital code generator comprises a second AND gate and an OR gate, two input ends of the second AND gate are connected to the positive output ends of the first comparator and the second comparator, two input ends of the OR gate are connected to an output end of the second AND gate and the positive output end of the third comparator, and an output end of the OR gate generates a higher bit of the two-bit digital code.

5. The high-speed successive approximation analog-to-digital converter of two bits per cycle of claim 1, wherein each of the first and second switch arrays comprises multiple groups of switches, each group comprises two symmetrical switch capacitor units, and each switch capacitor unit comprises an NAND gate, an AND gate, a tenth inverter, an eleventh inverter and a twelfth inverter, one input end of the NAND and the AND gate are connected to a clock signal, an output signal of the encoding circuit is connected to an input end of the tenth inverter and an input end of the AND gate, an output end of the tenth inverter is connected to another input end of the NAND gate, an output end of the NAND gate is connected to an input end of the eleventh inverter, an output end of the AND gate is connected to an input end of the twelfth inverter, and output ends of the eleventh and twelfth inverter are respectively connected to one plate of each of two same capacitors.

\* \* \* \* \*